United States Patent
Kim et al.

(10) Patent No.: US 9,572,196 B2
(45) Date of Patent: Feb. 14, 2017

(54) SMALL-SIZED BASE STATION DEVICE IN MOBILE COMMUNICATION SYSTEM

(71) Applicant: KMW Inc., Hwaseong, Gyeonggi-Do (KR)

(72) Inventors: Duk-Yong Kim, Gyeonggi-do (KR); Young-Chan Moon, Gyeonggi-do (KR); Myong-Sik Lee, Gyeonggi-Do (KR); Chang-Woo Yoo, Gyeonggi-Do (KR); Chi-Back Ryu, Gyeonggi-Do (KR)

(73) Assignee: KMW INC., Hwaseong, Gyeonggi-Do (KR)

( * ) Notice: Subject to any disclaimer, the term of this patent is extended or adjusted under 35 U.S.C. 154(b) by 0 days.

(21) Appl. No.: 14/713,780

(22) Filed: May 15, 2015

(65) Prior Publication Data

US 2015/0250022 A1 Sep. 3, 2015

Related U.S. Application Data

(63) Continuation of application No. PCT/KR2013/010428, filed on Nov. 15, 2013.

(30) Foreign Application Priority Data

Nov. 16, 2012 (KR) .................. 10-2012-0130257

(51) Int. Cl.
| | |
|---|---|
| *H04M 1/00* | (2006.01) |
| *H04W 88/08* | (2009.01) |
| *H01Q 1/24* | (2006.01) |
| *H04B 1/08* | (2006.01) |
| *H01Q 19/10* | (2006.01) |
| *H02K 5/18* | (2006.01) |

(52) U.S. Cl.
CPC .............. *H04W 88/08* (2013.01); *H01Q 1/246* (2013.01); *H01Q 19/108* (2013.01); *H02K 5/18* (2013.01)

(58) Field of Classification Search
CPC ............................... H04W 88/08; H01Q 1/246
USPC ........................................ 455/347–349, 561
See application file for complete search history.

(56) References Cited

U.S. PATENT DOCUMENTS

| | | | |
|---|---|---|---|
| 7,450,382 B1 | 11/2008 | Fischer et al. | |
| 2003/0216153 A1 | 11/2003 | Golioto | |

(Continued)

FOREIGN PATENT DOCUMENTS

| | | |
|---|---|---|
| EP | 1432296 A1 | 6/2004 |
| JP | 64-26436 | 1/1989 |

(Continued)

OTHER PUBLICATIONS

A Supplementary Search Report for corresponding European Patent Application No. 13855394.6 dated Jun. 28, 2016.

(Continued)

*Primary Examiner* — Lee Nguyen
(74) *Attorney, Agent, or Firm* — Mintz Levin Cohn Ferris Glovsky and Popeo, P.C.; Kongsik Kim

(57) ABSTRACT

A small-sized base station employed in a mobile communication system is disclosed. To this end, the small-sized base station in a mobile communication system, according to one embodiment of the present invention, is a base station device in a mobile communication system comprising: a case which has the shape of a polyhedron and is hollow inside; a housing accommodated inside the case and having the same polyhedron shape as the case; and at least one board which is positioned between the case and the housing.

13 Claims, 13 Drawing Sheets

(56) References Cited

U.S. PATENT DOCUMENTS

2007/0069613 A1  3/2007  DiNota et al.
2008/0130259 A1  6/2008  Hederoth

FOREIGN PATENT DOCUMENTS

| JP | 10-22900 | 1/1998 |
| JP | 2004-140015 A | 5/2004 |
| JP | 2008-244185 A | 10/2008 |
| WO | WO-2006-058341 A2 | 6/2006 |
| WO | 2009-133112 A1 | 11/2009 |

OTHER PUBLICATIONS

An Office Action for corresponding Japanese Patent Application No. 2015-542956 dated Jun. 27, 2016.

SMALL-SIZED BASE STATION DEVICE IN MOBILE COMMUNICATION SYSTEM

CROSS REFERENCE TO RELATED APPLICATIONS

This application is a continuation of International Application No. PCT/KR2013/010428 filed on Nov. 15, 2013, which claims priority to Korean Applications No. 10-2012-0130257 filed on Nov. 16, 2012, which applications are incorporated herein by reference.

TECHNICAL FIELD

The present disclosure relates to a base station device in a mobile communication system and, more particularly, relates to a compact base station device installed outdoors.

BACKGROUND ART

A base station in a mobile communication system refers to a system for relaying electric waves of portable terminals in a cell. The base station is mainly located on the roof of a building to relay the electric waves of the portable terminals. Accordingly, base stations exist in units of cells and control incoming/outgoing signal transmission, traffic channel definition, and traffic channel monitoring in addition to interface functions between portable terminals and switching stations in units of cells.

In addition, thanks to many advantages, control antennas capable of performing beam tilting in a vertical or horizontal direction have been widely used as antennas employed for base stations.

Furthermore, compact base stations that can reduce frequency loads and enhance call quality have been installed as systems for covering much smaller areas than the existing mobile communication service coverage. Such base station systems are used to receive data traffic intensively generated in small-scale areas. The compact base stations may be installed in buildings or homes, thereby making it possible to resolve dead spots and provide more enhanced network and convergence services.

However, the compact base stations employed for the conventional mobile communication systems have limitations in making the overall size smaller because major components mounted in the base stations, for example, a main board, a power supply unit, an antenna, a filter, a power amplification unit, and the like are stacked one above another.

In particular, although the conventional compact base stations have stable antenna characteristics with increasing cavity spaces arranged in a filter, the cavities are arranged to be narrow in a line. Therefore, the horizontal and vertical sizes of the filter having the cavities arranged therein are made larger in order to maintain the antenna characteristics satisfying customers' demands.

Particularly, since the main board and the power amplification unit are formed on one board in the conventional compact base stations, the overall size of the main board becomes large, and a problem of heat dissipation of the power amplification unit arises.

SUMMARY

Accordingly, an aspect of the present disclosure is to provide a compact base station device in a mobile communication system in which major components, for example a plurality of boards, are arranged in three dimensions on the inner surfaces of an enclosure functioning as an external case, thereby advantageously achieving compactness.

Another aspect of the present disclosure is to provide a compact base station device in a mobile communication system in which heat dissipation parts, for example heat sinks, are arranged on the outer surfaces of an enclosure in order to dissipate heat generated from a plurality of boards arranged in three dimensions in the right places on the outer surfaces of the enclosure, thereby achieving an excellent heat dissipation effect and compactness.

Another aspect of the present disclosure is to provide a compact base station device in a mobile communication system that is mainly suitable for outdoor use.

Another aspect of the present disclosure is to provide a compact base station device in a mobile communication system in which a plurality of power amplification units are disposed to be spaced apart from each other with the greatest possible distance therebetween, thereby minimizing a problem of heat dissipation.

Another aspect of the present disclosure is to provide a compact base station device in a mobile communication system in which a plurality of cavities of a filter are configured to be stacked on each other (to face each other) in the up-down direction, thereby resulting in wide cavity spaces and thus enhancing an antenna characteristic.

In order to solve such problems, the present disclosure proposes a compact base station having boards mounted on the inner surfaces of an enclosure in three dimensions and heat dissipation parts on the outer surfaces thereof.

Specifically, the compact base station, which is a base station device in a mobile communication system, includes: a hollow case having a polyhedral shape; a housing that is received in the case and has the same polyhedral shape as the case; and one or more board parts located between the case and the housing.

BRIEF DESCRIPTION OF THE DRAWINGS

The above and other aspects, features, and advantages of the present disclosure will be more apparent from the following detailed description taken in conjunction with the accompanying drawings, in which.

DETAILED DESCRIPTION

Figure 1:
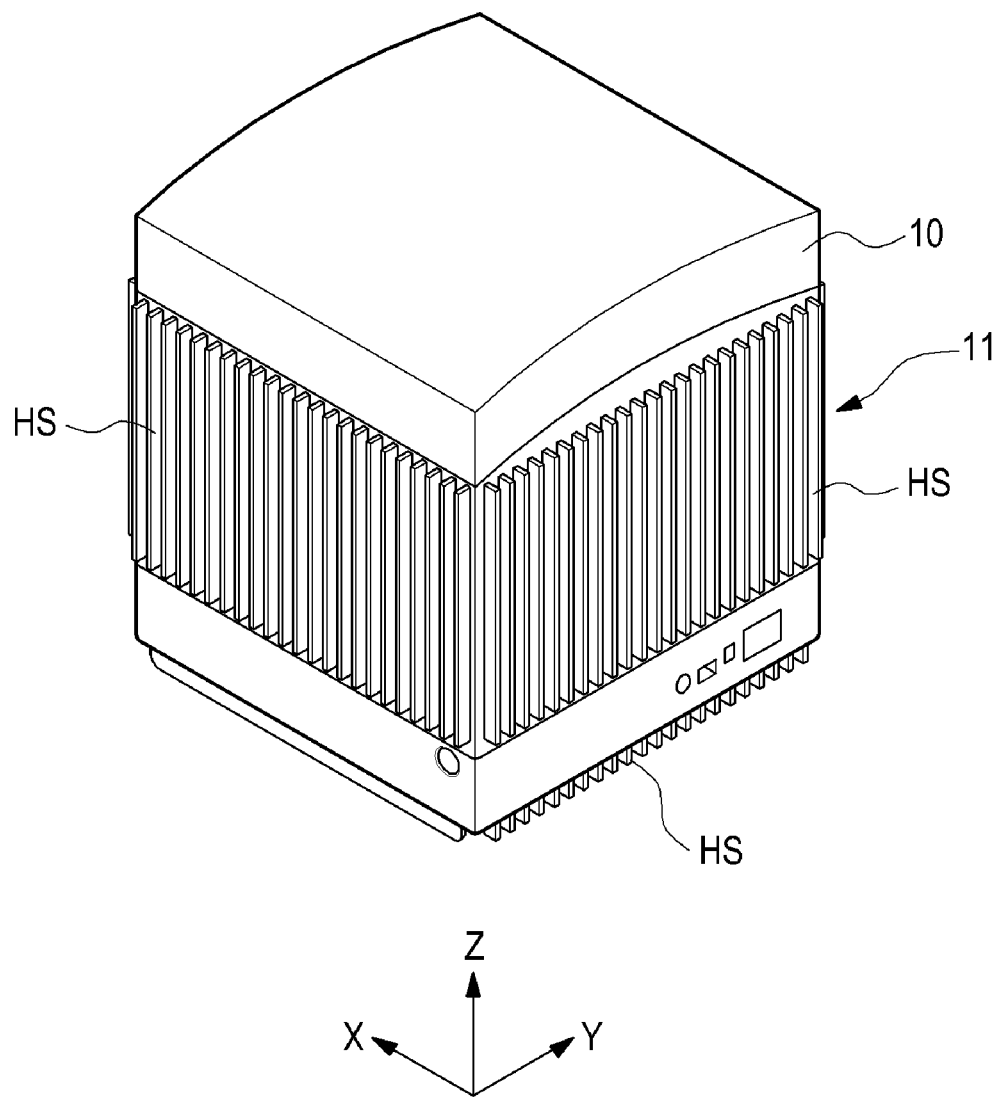
FIG. 1 is a perspective view illustrating an external appearance of a compact base station according to the present disclosure.

Hereinafter, the present disclosure will be described with reference to the accompanying drawings. Identical reference numerals indicate identical elements.

Figure 2:
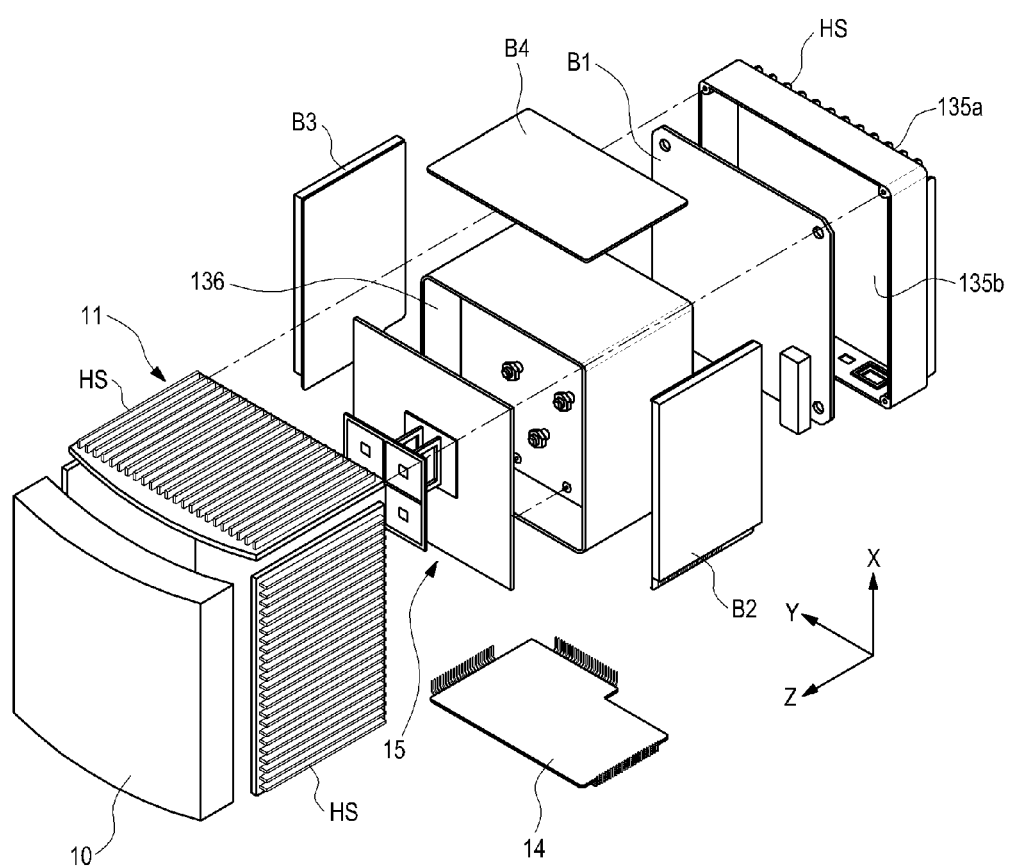
FIG. 2 is an exploded perspective view illustrating a configuration of the compact base station according to the present disclosure.
Figure 3:
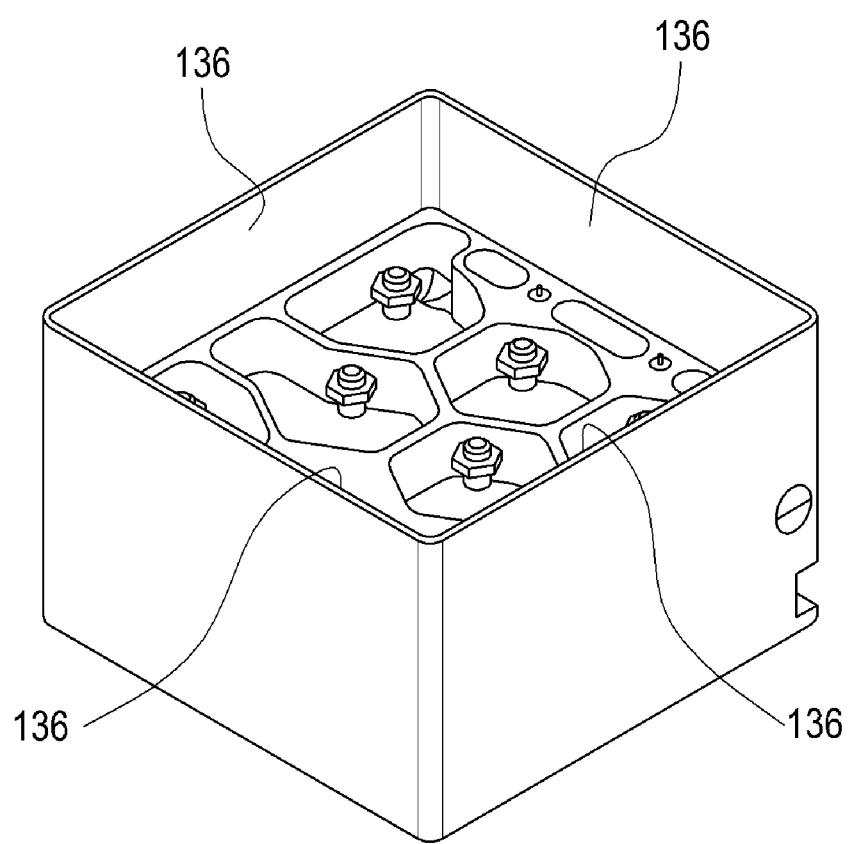
FIG. 3 is a perspective view of an antenna unit of the compact base station according to the present disclosure, with an antenna of the antenna unit omitted.

In describing a compact base station according to the present disclosure, the rectangular coordinate system illustrated in FIGS. 1 and 2 is used. 'X axis' refers to a horizontal direction, 'Y axis' refers to a vertical direction, and 'Z axis' refers to a direction perpendicular to the horizontal and vertical directions. The base station, according to the present disclosure, has a small horizontal length, a small vertical length, and a small thickness, compared to the related art, and despite the compactness, maintains the existing performance thereof. That is, the compactness means that the overall size of the base station is made smaller in the three axis directions than in the related art, and namely, means that one of the horizontal and vertical lengths and the thickness is made smaller. In addition, it should be noted that the base station, according to the present disclosure, is suitable for an outdoor base station with a high output level and has no problem of heat dissipation of a board despite the compactness thereof.

FIG. 1 illustrates an external appearance of a compact base station (hereinafter, referred to as a 'base station') in a mobile communication system according to the present disclosure. The illustrated base station is suitable for outdoor use in pursuit of compactness. Since an outdoor base station has a high output level, compared to an indoor base station, the outdoor base station has to allow for heat generated from boards while pursuing compactness thereof. Accordingly, the purpose of the present disclosure is to provide a compact base station for which a problem of heat dissipation is addressed.

FIG. 1 illustrates the external appearance of the base station in a completely assembled state in which a cover 10 and an enclosure 11 are coupled to each other. The enclosure 11 has heat dissipation parts HS on outer surfaces thereof which function to dissipate heat of boards to be described below. The heat dissipation parts HS refer to heat sinks to be described below. Reference numeral 11 indicates an outer enclosure exposed to an external environment. The outer enclosure is hereinafter referred to as an 'enclosure.'

FIG. 2 is an exploded perspective view illustrating a configuration of the base station according to the present disclosure. As illustrated in FIG. 2, the base station includes an antenna unit 15, three or more boards (printed circuit boards) B1 to B4, and a Power Supply Unit (PSU) 14, which are arranged in three dimensions in the interior of the enclosure 11, and the heat dissipation parts HS, for example, a plurality of heat sinks. The boards B1 to B4 are mounted on the inner surface of the enclosure 11, and the heat dissipation parts HS are mounted on the outer surface of the enclosure 11.

The aforementioned 'three dimensional arrangement' of the plurality of boards does not mean stacking the boards on one axis but arranging major elements, for example the boards, in view of three axes, including X, Y, and Z axes. In particular, the three dimensional arrangement means an arrangement in which a plurality of other boards are disposed orthogonal to one board along the X and Y axes, and the remaining major elements are disposed along the Z axis. Due to such a three dimensional arrangement, the base station, according to the present disclosure, is very advantageous for compactness. In addition, the base station, according to the present disclosure, includes a configuration for solving a problem caused by heat generated from the boards according to the three dimensional arrangement, in addition to the three dimensional arrangement for the compactness of the major elements.

Figure 7:
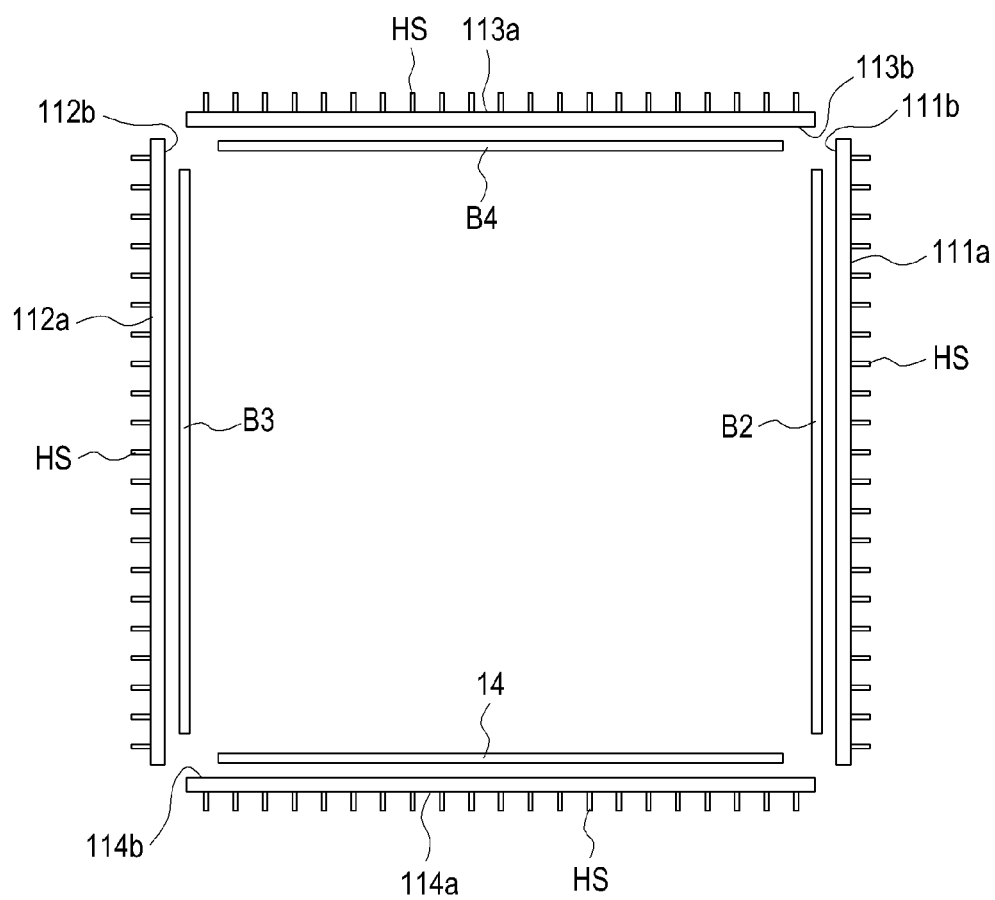
FIG. 7 is a plan view illustrating an arrangement state before boards are mounted on inner surfaces of an enclosure, respectively, according to the present disclosure.

With reference to FIG. 7 together with FIG. 2, the enclosure 11 will be described below. The enclosure 11 has a polyhedral shape and is constituted by coupling a plurality of plate-shaped members that have a plurality of outer surfaces 111*a* to 114*a* and 135*a* and inner surfaces 111*b* to 114*b* and 135*b*, respectively, and the antenna unit 15 is received in an inner enclosure that is on the rear side of the enclosure 11. In particular, the enclosure 11 has an open-topped box shape and includes three or more inner surfaces and three or more outer surfaces. The five outer surfaces 111*a* to 114*a* and 135*a* and the five inner surfaces 111*b* to 114*b* and 135*b*, included in the enclosure 11, are illustrated in FIGS. 2 and 7. However, the number of inner and outer surfaces may vary with the shape of the enclosure 11.

The plurality of outer surfaces include the first and second outer surfaces 111*a* and 112*a* opposite to each other, and the third and fourth outer surfaces 113*a* and 114*a* opposite to each other between the first and second outer surfaces 111*a* and 112*a*. The first and second outer surfaces 111*a* and 112*a* are parallel to each other, and the third and fourth outer surfaces 113*a* and 114*a* are parallel to each other. The first outer surface 111*a* is perpendicular to the third and fourth outer surfaces 113*a* and 114*a*, and the second outer surface 112*a* is perpendicular to the third and fourth outer surfaces 113*a* and 114*a*. In addition, the first to fourth outer surfaces 111*a* to 114*a* have a flat shape. Since the enclosure 11 has a rectangular parallelepiped shape, the first to fourth outer surfaces 111*a* to 114*a* have a rectangular shape.

The enclosure 11 includes the plurality of outer surfaces. In terms of the shapes of the outer surfaces, among the outer surfaces, the first and second outer surfaces 111*a* and 112*a* may be constituted in the same rectangular or square shape, the third and fourth outer surfaces 113*a* and 114*a* may also be constituted in the same rectangular or square shape, and the outer bottom surface 135*a* may also be constituted in a rectangular or square shape.

In addition, in terms of the sizes (areas) of the outer surfaces, the first and second outer surfaces 111*a* and 112*a* and the third and fourth outer surfaces 113*a* and 114*a* may be constituted by the same-sized rectangles, different-sized rectangles, or the same-sized squares.

Among the outer surfaces, the outer bottom surface 135*a* located at the bottom of the enclosure 11 may be constituted by a rectangle or square and may be constituted in a shape larger or smaller than, or the same as those of the first to fourth outer surfaces 111*a* to 114*a*. The enclosure 11, according to the present disclosure, is preferably configured such that the outer bottom surface 135*a* is larger in area than the first and second outer surfaces 111a and 112a or the third and fourth outer surfaces 113a and 114a. In FIG. 2, the outer bottom surface 135a is illustrated to be larger in area than the first to fourth outer surfaces 111a to 114a. For the inner enclosure in the interior of the enclosure, the bottom surface thereof is configured to have the largest area, and the antenna unit 15 is preferably disposed on the bottom surface of the inner enclosure.

The inner surfaces include the first and second inner surfaces 111b and 112b facing each other, and the third and fourth inner surfaces 113b and 114b facing each other between the first and second inner surfaces 111b and 112b. The first and second inner surfaces 111b and 112b are parallel to each other, and the third and fourth inner surfaces 113b and 114b are parallel to each other. The first inner surface 111b is perpendicular to the third and fourth inner surfaces 113b and 114b, and the second inner surface 112b is perpendicular to the third and fourth inner surfaces 113b and 114b. In addition, the first to fourth inner surfaces 111b to 114b have a flat shape. Since the enclosure 11 has a rectangular parallelepiped shape, the first to fourth inner surfaces 111b to 114b have a rectangular shape.

The enclosure 11 includes the plurality of inner surfaces. In terms of the shapes of the inner surfaces, among the inner surfaces, the first and second inner surfaces 111b and 112b may be constituted in the same rectangular or square shape, the third and fourth inner surfaces 113b and 114b may also be constituted in the same rectangular or square shape, and the inner bottom surface 135b may also be constituted in a rectangular or square shape.

In addition, in terms of the sizes (areas) of the inner surfaces, the first and second inner surfaces 111b and 112b and the third and fourth inner surfaces 113b and 114b may be constituted by the same-sized rectangles, different-sized rectangles, or the same-sized squares.

Among the inner surfaces, the inner bottom surface 135b located at the bottom of the enclosure 11 may be constituted by a rectangle or square and may be constituted in a shape larger or smaller than, or the same as those of the first to fourth inner surfaces 111b to 114b. The enclosure 11, according to the present disclosure, is preferably configured such that the inner bottom surface 135b is larger in area than the first and second inner surfaces 111b and 112b or the third and fourth inner surfaces 113b and 114b. In FIG. 2, the inner bottom surface 135b is illustrated to be larger in area than the first and second inner surfaces 111b and 112b or the third and fourth inner surfaces 113b and 114b.

Specifically, the arrangement of the boards mounted on the inner surfaces of the enclosure 11 will be described.

The plurality of boards B1 to B4 and the power supply unit 14 are disposed on the inner surfaces of the enclosure 11. The plurality of boards includes the first to fourth boards B1 to B4. The first board B1 is disposed on the inner bottom surface 135b of the enclosure 11. The second and third boards B2 and B3 are disposed on the first and second inner surfaces 111b and 112b of the enclosure 11, respectively. The fourth board B4 is disposed on the third inner surface 113b. The power supply unit 14 is disposed on the fourth inner surface 114b.

The first board B1 is a digital interface module and is disposed parallel to the inner bottom surface 135b of the enclosure while facing the inner bottom surface 135b. The second board B2 is a first power amplification unit (PAM) and is disposed parallel to the first inner surface 111b while facing the first inner surface 111b. The third board B3 is a second power amplification unit (PAM) and is disposed parallel to the second inner surface 112b while facing the second inner surface 112b. The fourth board B4 is an up/down converter and is disposed parallel to the third inner surface 113b while facing the third inner surface 113b. The power supply unit 14 is disposed parallel to the fourth inner surface 114b while facing the fourth inner surface 114b.

As mentioned above, the first to fourth boards B1 and B4 and the power supply unit 14 have a plate shape and may be disposed to be brought close to the inner surfaces of the enclosure, specifically, the first to fourth flat inner surfaces 111b to 114b and the inner bottom surface 135b, or may be disposed to be spaced apart from the inner surfaces with a gap therebetween. The first and second power amplification units B2 and B3 are parallel while facing each other. The up/down converter B4 and the power supply unit 14 are parallel to and face each other while being spaced apart from each other.

The first and second power amplification units B2 and B3 are disposed to be spaced apart from each other with the antenna unit therebetween in consideration of heat dissipation efficiency. That is, considering a problem of heat dissipation, a non-illustrated power amplification element is disposed in the first and second power amplification units B2 and B3. In other words, in cases where the plurality of power amplification units B2 and B3 exist, it is most effective against heat dissipation to dispose the power amplification units with the largest separation distance therebetween. In cases where the enclosure 11 has a hexahedral shape as illustrated in the drawing, the power amplification units are most preferably disposed to face each other, and even when the enclosure 11 is embodied in a variety of shapes, it is most preferable to dispose the power amplification units with the largest separation distance therebetween. In addition, it will be sufficiently available to those skilled in the art to constitute each power amplification unit with two divided boards rather than one board in consideration of a problem of heat dissipation.

Although it has been exemplified that the first and second power amplification units B2 and B3 are disposed on the first and second inner surfaces 111b and 112b, respectively, the first and second power amplification units B2 and B3 may also be disposed on the third and fourth inner surfaces 113b and 114. Also, while it has been exemplified that the up/down converter B4 and the power supply unit 14 are disposed on the third and fourth inner surfaces 113b and 114b, respectively, the up/down converter B4 and the power supply unit 14 may also be disposed on the first and second inner surfaces 111b and 112b when the first and second power amplification units B2 and B3 are disposed on the third and fourth inner surfaces 113b and 114b. The up/down converter B4 and the power supply unit 14 are maintained to be spaced apart from each other while facing each other. The first power amplification unit B2 is perpendicular to the digital interface module B1, the up/down converter B4, and the power supply unit 14, and the second power amplification unit B3 is perpendicular to the digital interface module B1, the up/down converter B4, and the power supply unit 14.

In the arrangement of the plurality of boards employed for the base station, the second to fourth boards B2 to B4 are disposed orthogonal to the first board B1 along the periphery of the first board B1.

Referring to FIGS. 3 to 6, the antenna unit 15 is disposed in the inner enclosure which is in the interior of the enclosure. The antenna unit 15 includes an antenna 150, an antenna transmission/reception module, a reflection plate 151, a ground plate 152, and a plurality of radiating elements 153. The ground plate 152 and the radiating elements 153 are electrically connected to transfer a radiometric signal therebetween. Each of the plurality of radiating elements 153 includes a radiating pattern section. The radiating pattern may be implemented to be a rectangular shape, a circular shape, a rectangular ring shape, or the like.

Figure 4:
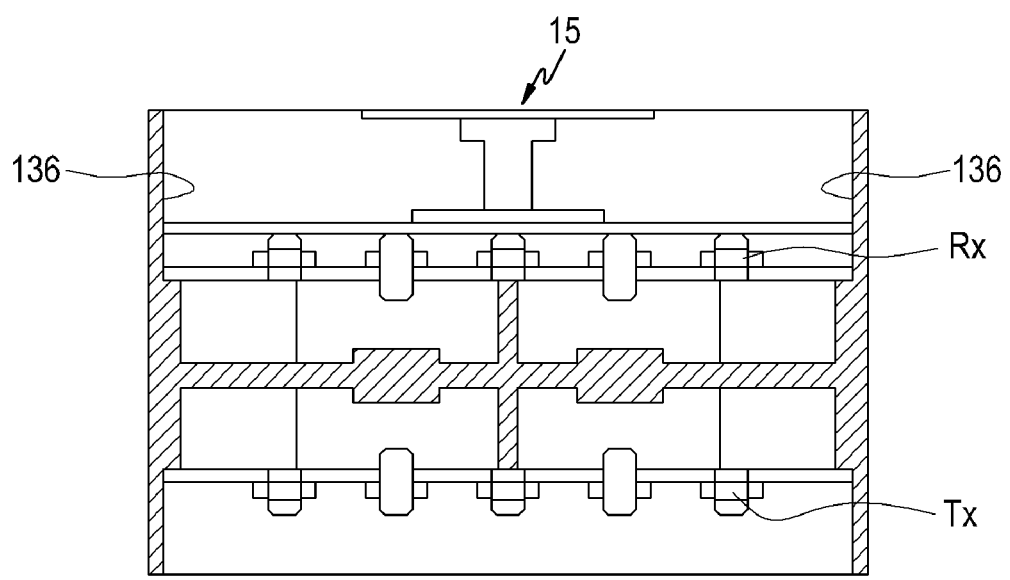
FIG. 4 is a sectional view of the antenna unit of the compact base station according to the present disclosure.
Figure 5:
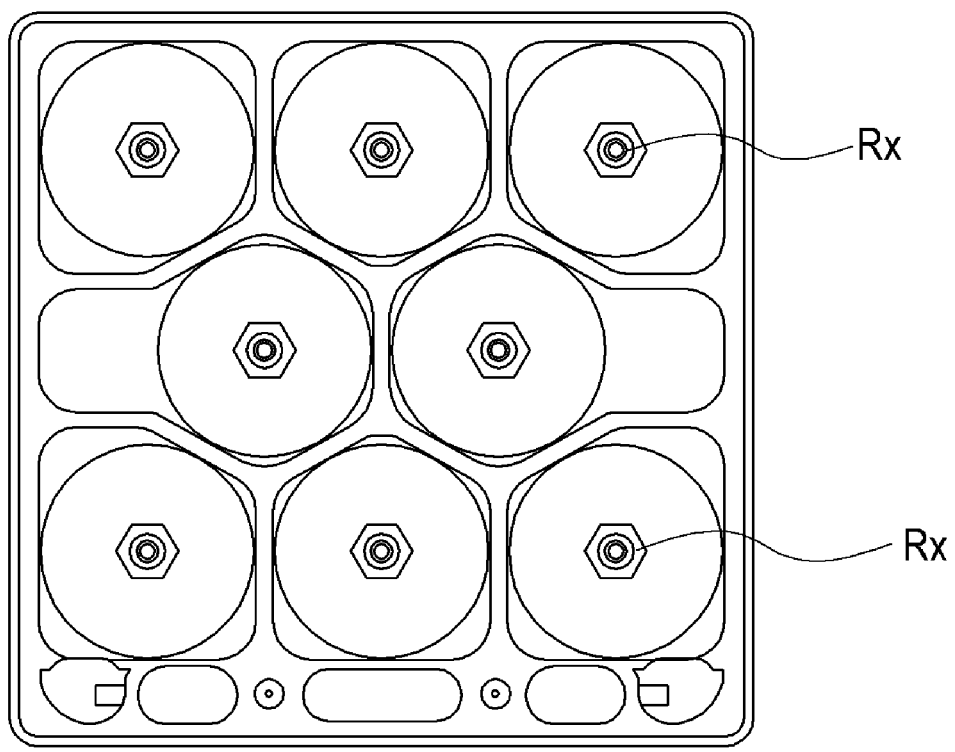
FIG. 5 is a plan view of the antenna unit of the compact base station according to the present disclosure, with the antenna of the antenna unit omitted.
Figure 6:
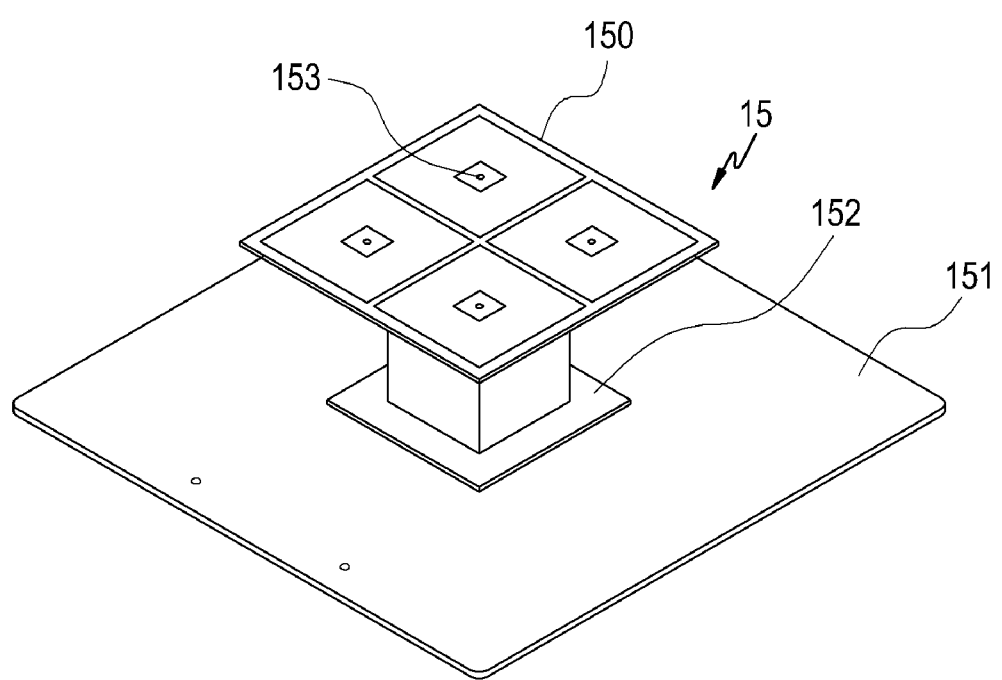
FIG. 6 is a perspective view of the antenna of the compact base station according to the present disclosure.

As illustrated in FIG. 4, when the antenna unit 15 is disposed in the inner enclosure, four inner walls 136 function as an antenna reflection plate.

In this embodiment, the inner enclosure has a rectangular parallelepiped shape, and filters having a cavity therein are illustrated as an example. However, the present disclosure is not limited thereto. The filter unit includes two or more filters (Tx, Rx) coupled to the interior of the inner enclosure to face each other. In FIG. 4, it is illustrated that the filters having the cavity are disposed to face each other in the up-down direction.

In cases where the inner enclosure has a polyhedral shape, the antenna unit 15 is preferably disposed on the largest one of five outer surfaces of the inner enclosure. That is, since an RF characteristic is enhanced with the increasing allowable area of the reflection plate 151 of the antenna unit 15, the antenna unit 15 is preferably mounted on the largest surface as illustrated in the drawing.

A configuration of the outer surfaces of the enclosure 11 will be described with reference to FIGS. 1 and 7. The enclosure is formed of a metal material, for example aluminum, and performs a heat dissipation function when exposed to an external environment. In addition, it has been illustrated that the respective boards are mounted on the inner surfaces of the enclosure 11, namely, the first to fourth inner surfaces and the inner bottom surface.

In particular, the heat dissipation parts, for example, the heat sinks HS are additionally mounted on the outer surfaces 111a to 114a of the enclosure 11. The heat dissipation parts HS mounted on the respective outer surfaces perform a function of transferring heat generated from the boards B2 to B4 and 14 to the outside. The heat dissipation parts HS mounted on the respective outer surfaces of the enclosure surround the exterior of the enclosure. The heat dissipation parts are mounted on the first to fourth outer surfaces 111a to 114a, which are on four sides of the enclosure, and the outer bottom surface, respectively.

Hereinafter, a mounting structure in which a board is mounted on the inner surface of the enclosure of the base station, according to the present disclosure, will be described with reference to FIGS. 7 to 9.

In FIG. 7, the respective boards B2 to B4 and 14 are mounted on the first to fourth inner surfaces 111b to 114b constituting the enclosure 11. The lateral appearance of the enclosure is formed by coupling four lateral members. The respective boards are mounted on the inner surfaces of the members, and then the member and the board, integrated into one body, are coupled to each other through a non-illustrated fastening element, for example a screw, to form the lateral appearance of the enclosure. At the same time, the boards are connected to the members using soldering, a connector, or the like.

At this time, each of the boards may be mounted on the inner surface through the following two methods.

Figure 8:
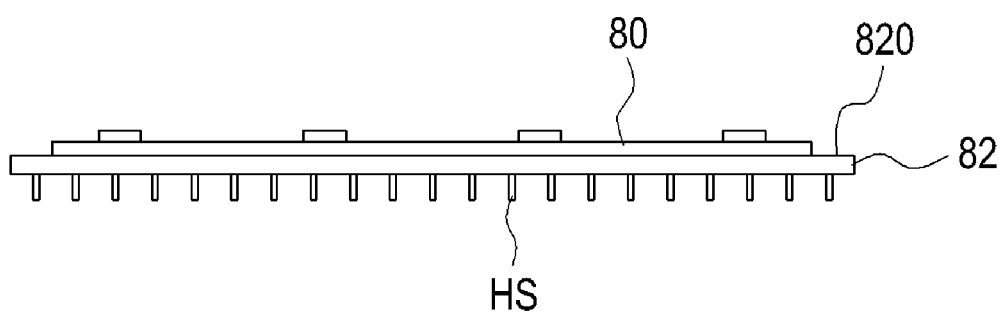
FIG. 8 illustrates an example of mounting a board on an inner surface of the enclosure according to the present disclosure.

As illustrated in FIG. 8, a board 80 may be mounted on an inner surface 820 of an enclosure member 82 through close surface-to-surface contact therebetween. That is, the board 80 has various electronic components mounted on the upper surface thereof, and the bottom surface of the board 80 is brought close to the inner surface 820. As described above, the enclosure includes the four outer surfaces and the outer bottom surface, on which the heat dissipation parts HS, for example the heat sinks, are disposed. Meanwhile, the enclosure includes four inner surfaces and one inner bottom surface. The board is directly brought close to the inner surface, and thus heat generated from the board 80 is transferred to the outside through the heat sink HS mounted on the outer surface of the enclosure.

Figure 9:
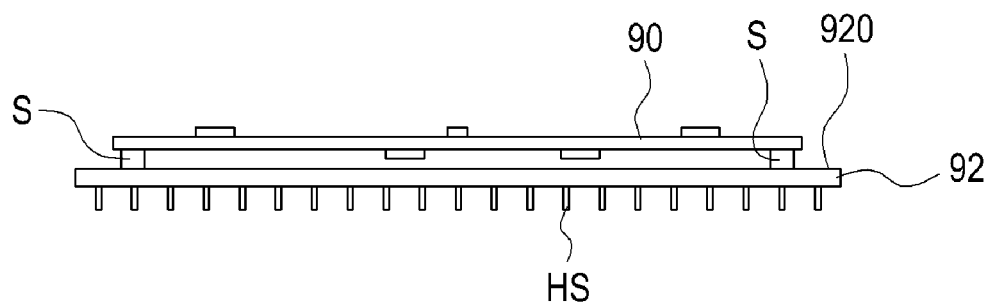
FIG. 9 illustrates another example of mounting a board on an inner surface of the enclosure according to the present disclosure.

As illustrated in FIG. 9, a board 90 may be mounted to an inner surface 920 of an enclosure member 92 while facing the inner surface 920 with a slight gap therebetween, namely, may be mounted to be spaced apart from the inner surface 920 of the enclosure member 92. If various electronic components are mounted on the upper and lower surfaces of the board 90, the board 90 may be mounted to the inner surface 920 with some distance therebetween. To this end, a plurality of spacers S is formed at predetermined locations of the inner surface.

Among the above-described boards, the power amplification unit generates a larger amount of heat than the other boards due to the power amplification element. Accordingly, it is preferable that the power amplification unit be directly mounted to be brought close to the inner surface 820 through the method illustrated in FIG. 8. In addition, a board having various components mounted on the upper and lower surfaces thereof is preferably mounted on the inner surface through the method illustrated in FIG. 9.

The enclosure of the base station, according to the present disclosure, is constituted by the members having the plurality of inner and outer surfaces. The members may be mechanically connected to each other by non-illustrated fastening elements, and the boards may be interconnected through non-illustrated connectors or soldering. Detailed descriptions related to the mechanical connection between the members or the electrical connection between the boards will be omitted in order not to unnecessarily obscure the features of the present disclosure.

Hereinafter, another embodiment of an antenna base station will be described with reference to FIGS. 10 to 14. The antenna base station according to the above-described embodiment is the same as that according to this embodiment in that a board is coupled to be brought close to the interior of an enclosure, and heat generated from the board is released through an outer enclosure. However, the antenna base station, according to the above-described embodiment, is configured such that the board is coupled to the inner enclosure while being coupled to the interior of the outer enclosure in advance. In contrast, the antenna base station, according to this embodiment, is configured such that an outer enclosure covers an inner enclosure while a board is mounted in advance to the inner enclosure. Accordingly, the descriptions in the foregoing embodiment will be applied to the same configurations or contents as the above-described ones.

Figure 10:
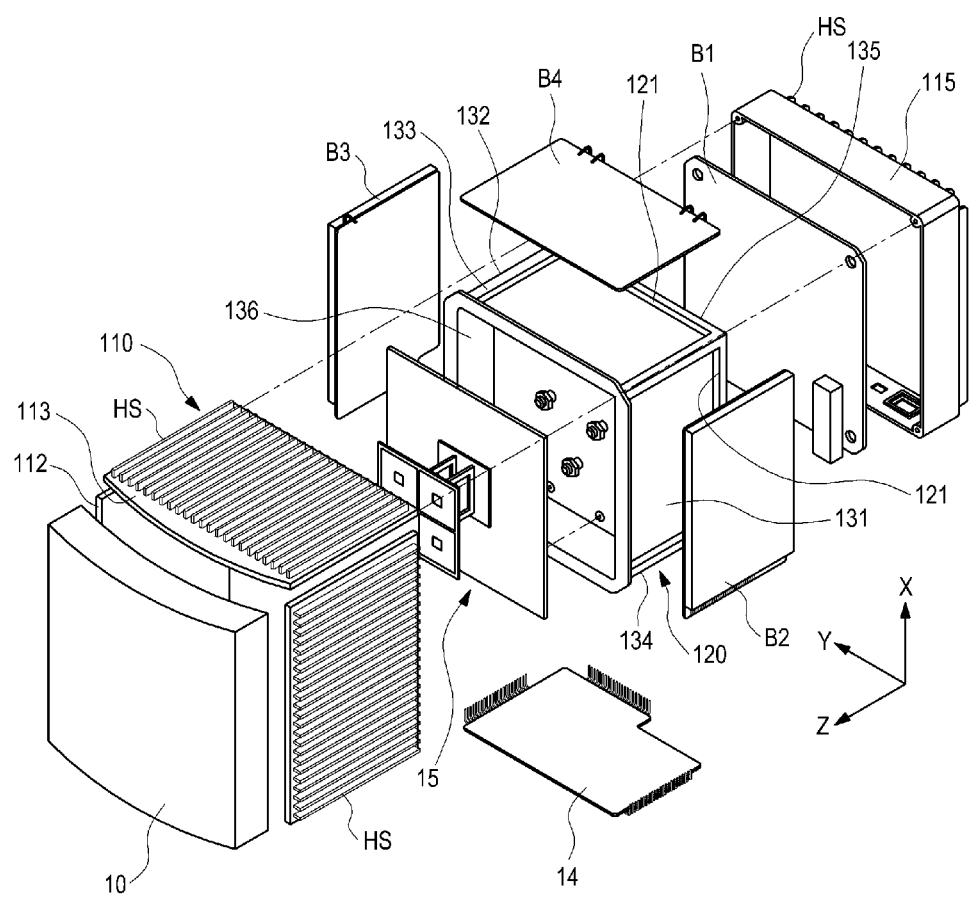
FIG. 10 is an exploded perspective view of an antenna base station according to one of various embodiments of the present disclosure.

FIG. 10 is an exploded perspective view of an antenna base station according to one of various embodiments of the present disclosure. Referring to FIG. 10, the antenna base station of the present disclosure may include a filter housing 120, board parts B1 and B2 (including one or more boards, a power supply unit, etc.), and a case 110. In the base station, an antenna unit 15, the board parts B1 and B2, and the case 110 may be arranged in the right places in three dimensions with respect to the filter housing 120. As described above, the three dimensional arrangement means that major elements are arranged in consideration of three axes including X, Y, and Z axes. In particular, when such elements are arrange and assembled, ease of heat dissipation or assembly is considered.

Figure 11:
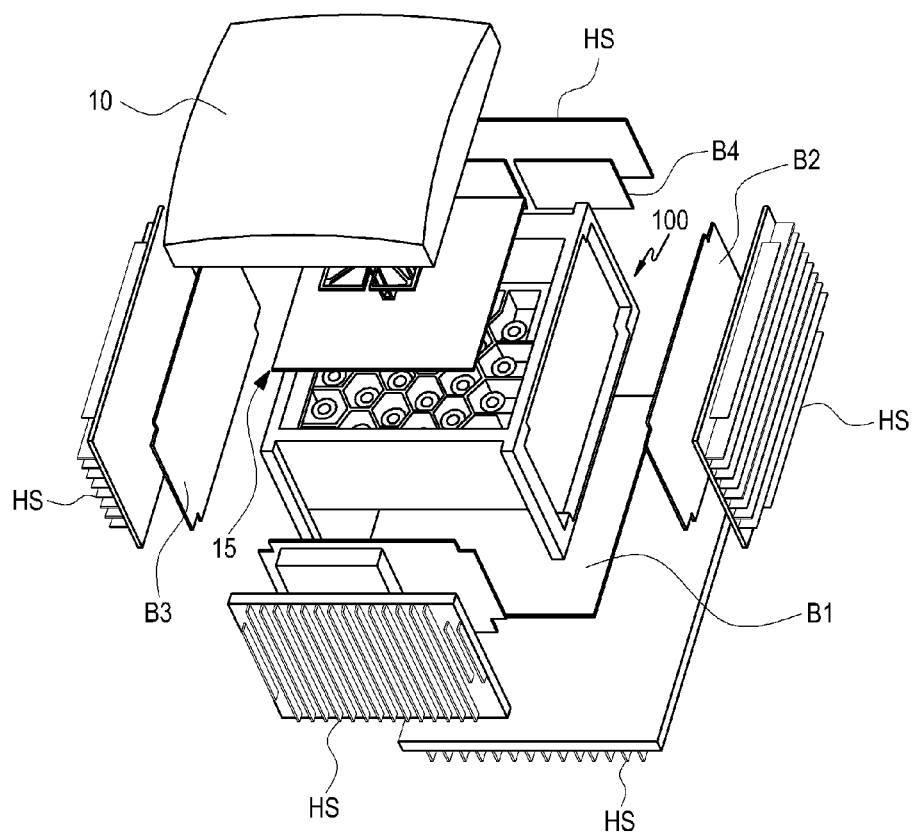
FIGS. 11 and 12 illustrate a state in which boards are mounted to a filter housing in the antenna base station illustrated in FIG. 10.
Figure 12:
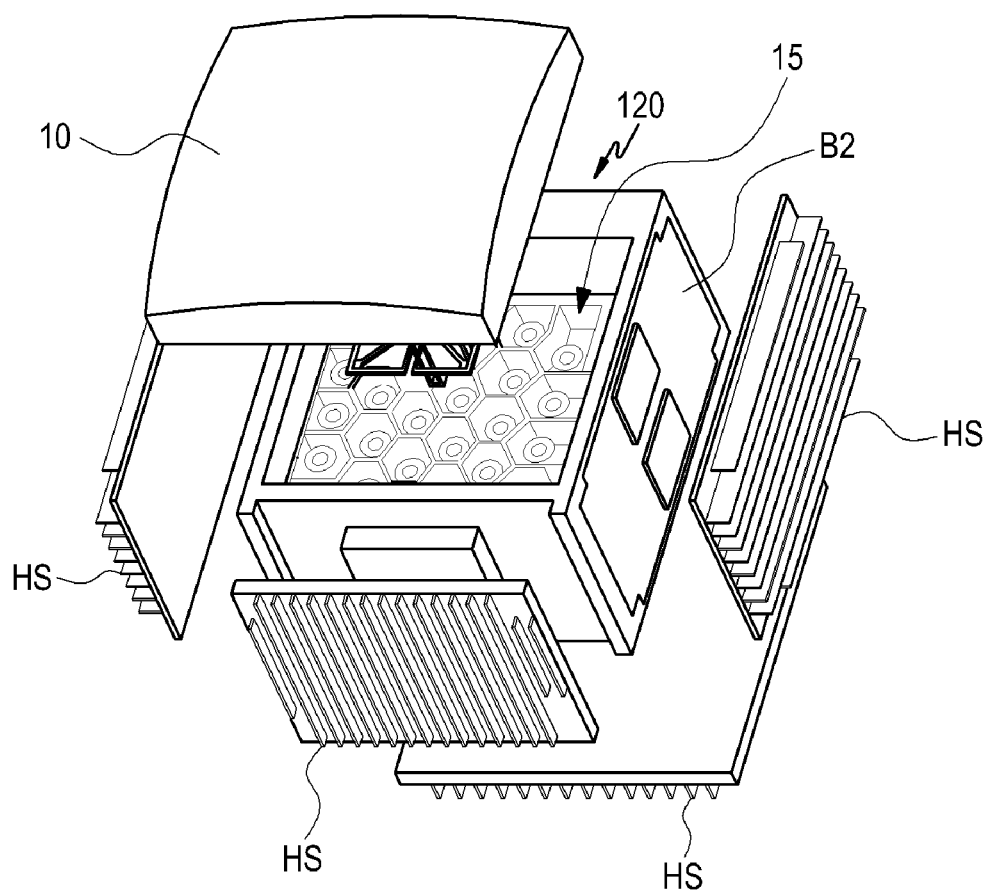
Figure 13:
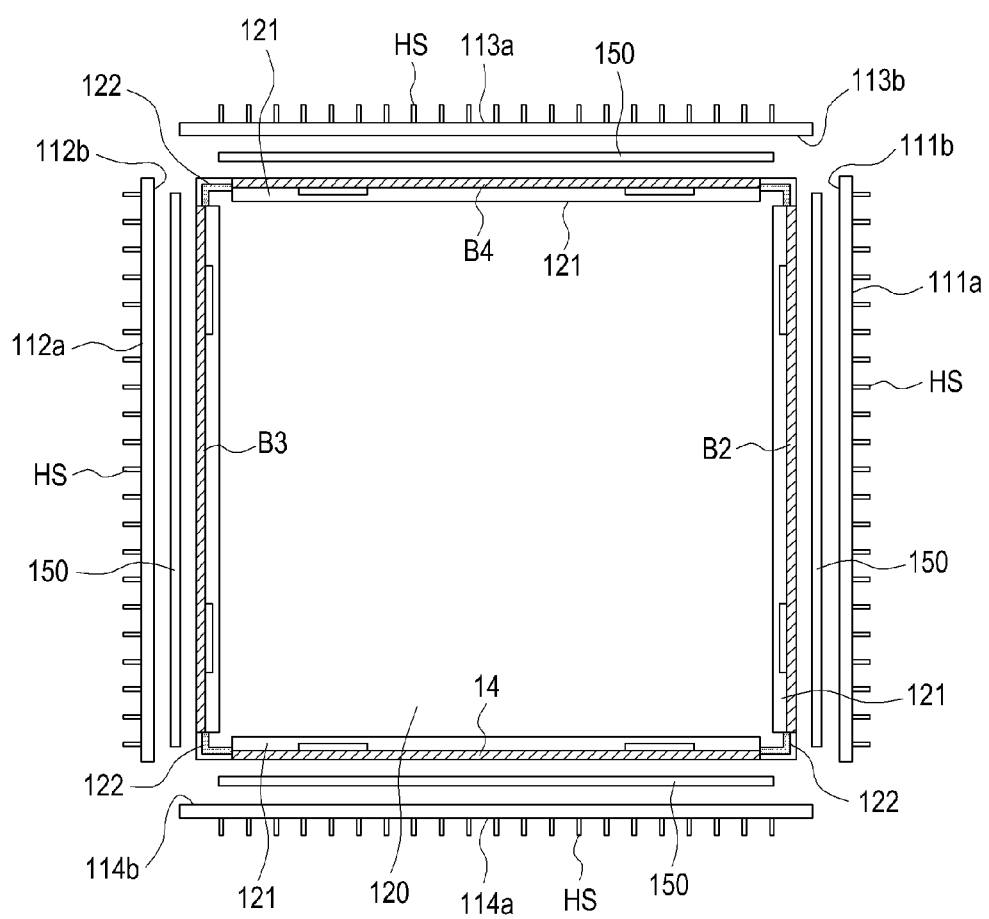
FIG. 13 is a schematic sectional view of the antenna base station illustrated in FIG. 11.

FIGS. 11 and 12 illustrate a state in which boards are mounted to the filter housing in the antenna base station illustrated in FIG. 10. FIG. 13 is a schematic sectional view of the antenna base station illustrated in FIG. 11. Referring to FIGS. 11 to 13, the filter housing 120 corresponds to the inner enclosure, and the case 110 corresponds to the enclosure 11 in the foregoing embodiment. The filter housing 120 may be referred to as various other names, such as an enclosure (an inner enclosure), a filter unit, a main body, and the like, (hereinafter, referred to as the 'filter housing 120'). The filter housing 120 of the present disclosure refers to an element that has a box shape and is included in the antenna base station by receiving the antenna unit 15 in the internal space thereof and mounting board parts B1 to B4 thereto. In addition, the case 110 may be referred to as various other names, such as an enclosure (an outer enclosure), a housing, a cover, and the like, (hereinafter, referred to as the 'case 110'). The case 110 of the present disclosure refers to the outermost element of the antenna base station that covers the filter housing 120 having the antenna unit 15 therein and the board parts B1 to B4.

The filter housing 120 has a polyhedral shape and has a plurality of outer surfaces and an internal space according to the shape thereof. For example, it will be exemplified that the filter housing 120 of the present disclosure has a rectangular parallelepiped shape. The filter housing 120 having such a rectangular parallelepiped shape may have six outer surfaces and one internal space. The filter housing 120 includes two pairs of outer surfaces facing each other and one pair of outer top and bottom surfaces facing each other. That is, the filter housing 120 may be divided into the first and second outer surfaces 131 and 132, the third and fourth outer surfaces 133 and 134 that are adjacent to the first and second outer surfaces 131 and 132 and face each other, the top surface 136, and the bottom surface 135.

Mounting portions 121 are formed in the respective outer surfaces 131 to 136 in order to mount the board parts B1 to B4 thereon. The mounting portions 121 may have a recess shape that is depressed such that the board parts B1 to B4 mounted on the outer surfaces may be seated thereon. Accordingly, the filter housing 120 has such a shape that the antenna unit 15 is mounted therein and the recesses depressed in a predetermined shape are formed in the outer surfaces thereof.

Connection openings 122 are formed in the mounting portions 121. The connection openings 122 may make the adjacent mounting portions 121 communicate with each other, and connection terminals may be mounted to the connection openings 122 to electrically connect the boards seated on the adjacent outer surfaces. Accordingly, when the board parts B1 to B4 are mounted on the outer surfaces 131 to 136, the adjacent board parts B1 to B4 may be electrically connected through the connection openings 122. Therefore, the connection terminals are not exposed to the outside and the board parts B1 to B4, after mounted to the filter housing 120, may make surface-to-surface contact with the case 110 for heat dissipation (see FIG. 11).

Each of the board parts B1 to B4 and 14, according to the embodiment of the present disclosure, has modules, for example chips, mounted on one surface thereof and is coupled to the mounting portion 121 such that the one surface of each board part orients toward the outer surface of the filter housing 120. Accordingly, the other surface of each board part is exposed through the outer surface of the filter housing 120, and when the case 110 to be described below covers the filter housing 120, the other surface of the board part may make surface-to-surface contact with the inner surface of the case 110, and heat generated from the board part may be released to the case 110 as well as the filter housing 120.

The board parts B1 to B4 and 14 may include boards including one or more of a digital interface module B1 (DIM board), power amplification units B2 and B3 (PAM board), an up/down converter B4 (also, referred to as an LAN board), and a power supply unit 14 (PSU board). It is apparent that the boards may be diversely arranged in three dimensions in view of the installation direction of the antenna base station or the performance of the internal elements thereof.

In the present disclosure, it will be exemplified that the board parts B1 to B4 and 14 are provided on the outer surfaces 131 to 136. The digital interface module B1 (DIM board) is inserted into the mounting portion 121 of the bottom surface 135 of the filter housing 120 and disposed parallel to the bottom surface 135, and the first power amplification unit B2 (PAM board) is inserted into the mounting portion 121 of the first outer surface 131 and disposed parallel to the first outer surface 131. The second power amplification unit B3 (PAM board) is inserted into the mounting portion 121 of the second outer surface 132 and disposed parallel to the second outer surface 132, and the up/down converter B4 (LAN board) is inserted into the mounting portion 121 of the third outer surface 133 and disposed parallel to the third outer surface 133. The power supply unit 14 (PSU board) is provided on the fourth outer surface 134 opposite to the third outer surface. Here, the first and second power amplification units B2 and B3 may be disposed to be spaced apart from each other while facing each other with the filter housing 120 therebetween, considering heat dissipation efficiency. That is, power amplification elements are disposed in the first and second power amplification units B2 and B3 and generate high-temperature heat. The heat generated from the power amplification elements have an influence on the radiation performance of the antenna unit 15 provided in the filter housing 120. Therefore, when the first and second power amplification units B2 and B3 are provided to be adjacent to each other with the filter housing 120 therebetween, the heat generated from the power amplification elements may be concentrated on a side. Accordingly, in cases where a plurality of power amplification units are provided, the power amplification units may be disposed to face each other with the filter housing 120 therebetween to prevent heat from being concentrated on a side.

As in the present disclosure, when the filter housing 120 has a rectangular parallelepiped shape, it is proposed that the first and second power amplification units B2 and B3 are formed to face each other. However, in cases where the filter housing 120 has a polyhedral shape, the power amplification units may be preferably mounted on the mounting portions 121 of the outer surfaces with the greatest distance therebetween. However, it is apparent to those skilled in the art that the board parts B1 to B4 and 14 may be mounted in view of the interference therebetween as well as a problem of heat dissipation.

Although it has been exemplified that the first and second power amplification units B2 and B3 are disposed on the first and second outer surfaces 131 and 132, respectively, the first and second power amplification units B2 and B3 may also be disposed on the third and fourth outer surfaces 133 and 134. Also, while it has been exemplified that the up/down converter B4 and the power supply unit 14 are disposed on the third and fourth outer surfaces 133 and 134, respectively, the up/down converter B4 and the power supply unit 14 may also be disposed on the first and second outer surfaces 131 and 132 when the first and second power amplification units B2 and B3 are disposed on the third and fourth outer surfaces 133 and 134. The up/down converter B4 and the power supply unit 14 are maintained to be spaced apart from each other while facing each other. The first power amplification unit B2 may be perpendicular to the digital interface module B1, the up/down converter B4, and the power supply unit 14, and the second power amplification unit B3 may be perpendicular to the digital interface module B1, the up/down converter B4, and the power supply unit 14. However, the mounting location thereof may be changed without any specific limitation.

As described above, when the board parts B1 to B4 and 14 are fastened to the mounting portions 121, with one surface of each board part orienting toward the corresponding outer surface, the board parts B1 to B4 and 14 may be electrically connected to each other through the connection openings 122. Therefore, the adjacent board parts B1 to B4 and 14 may be interconnected only by fastening the board parts B1 to B4 and 14 to the mounting portions 121 of the filter housing 120 without using separate connection terminals. When the board parts B1 to B4 and 14 are coupled to the mounting portions 121, the other surface of each board part forms an outer surface of the filter housing 120. When the case 110 to be described below is fastened to cover the filter housing 120, the other surface of each board part may make surface-to-surface contact with an inner surface of the case 110 (see FIGS. 12 and 13).

Since the board parts B1 to B4 and 14 are fastened to the filter housing 120 and make surface-to-surface contact with the inner surfaces of the case 110 at the same time, the heat generated from the power amplification elements, provided to the above-described power amplification units, may be released to the outside not only through the filter housing 120 but also through the case 110, thereby enhancing a heat-dissipation effect.

In this case, thermal pads 150 may be interposed between the board parts B1 to B4 and 14 and the case 110. Even though the board parts B1 to B4 and 14 actually make surface-to-surface contact with the case 110, a degree to which the board parts B1 to B4 and 14 and the case 110 are brought close to each other microscopically varies with the processed state thereof. Accordingly, the thermal pads 150 may be further included to increase the degree, thereby doubling the heat dissipation effect.

As described above, the board parts B1 to B4 and 14 are seated on and coupled to the mounting portions 121 of the filter housing 120. The board parts B1 to B4 may be fastened in various manners. For example, the board parts B1 to B4 and 14 may have holes formed therein to which screws are fastened and may be fastened to the mounting portions 121 through the screws, or the board parts B1 to B4 and 14 may be fastened to the mounting portions 121 using fastening members such as double-sided adhesive tape. However, it is apparent that the fastening element may be changed or modified without any specific limitation. The case 110 covers the filter housing 120 while the board parts B1 to B4 and 14 are fastened to the filter housing 120. That is, in the foregoing embodiment, according to the assembly sequence, the board parts B1 to B4 and 14 are mounted on the case 110, and the adjacent board parts B1 to B4 and 14 are coupled to the outer surface of the filter housing 120 while being electrically connected to each other.

In addition, in this embodiment, when the board parts B1 to B4 and 14 are mounted on the mounting portions 121 of the filter housing 120, the adjacent board parts B1 to B4 and 14 may be electrically connected to each other through the connection openings 122. When the case 110 covers the filter housing 120 while being brought close to the outsides thereof in this state, the other surface of each board part is brought close to an inner surface of the case 110, and the case 110 is assembled to the filter housing 120 while covering the same.

Figure 14:
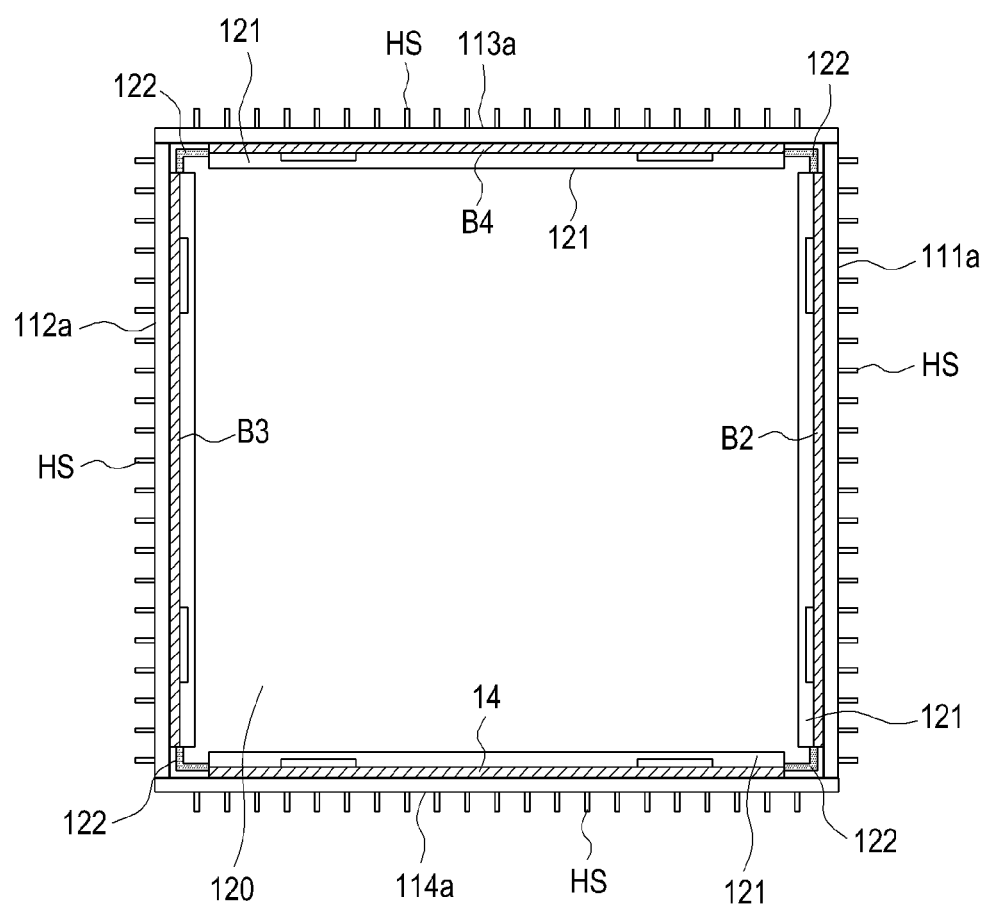
FIG. 14 illustrates a state in which the antenna base station illustrated in FIG. 11 is assembled.

FIG. 14 illustrates a state in which the antenna base station illustrated in FIG. 11 is assembled. Referring to FIG. 14, although the case 110 covering the filter housing 120 may be an integrated cover, the case 110 configured to have a plurality of plates 111 to 114 coupled to each other and cover surfaces of a polyhedral shape will be exemplified in the embodiment of the present disclosure.

The plates 111 to 114 include a heat dissipation part HS on the outer surface thereof which forms a heat sink having a plurality of sinks that are formed to be adjacent to each other. Due to this, inner surfaces 111*b* to 114*b* of the plates are brought close to and coupled to the other surfaces of the board parts B1 to B4 and 14 while facing the same. For the filter housing 120 having a cubic shape, the plates 111 to 114 may be provided to the respective outer surfaces thereof except for the outer top surface 137 through which the antenna unit 15 is mounted.

The base station of the present disclosure is assembled by coupling the board parts B1 to B4 and 14 to the filter housing 120 and then coupling the plates 111 to 114 to the respective outer surfaces 131 to 136 of the filter housing 120, thereby simplifying the assembly process. In addition, the board parts B1 to B4 and 14 coupled to the adjacent mounting portions 121 may be simply electrically connected to each other through the connection openings 122 without using separate connection wires. Accordingly, there are no externally exposed connection wires between the board parts, and thus current can more stably flow and the assembly process can be more simplified.

Furthermore, as in the foregoing embodiment, the board parts B1 to B4 and 14 make surface-to-surface contact with the case 110 so that heat generated from the board parts B1 to B4 and 14 can be released to the outside through the case 110. In addition, since the board parts B1 to B4 of the present disclosure are coupled to the filter housing 120, the heat can also be dissipated through the filter housing 120, thereby maximizing heat dissipation efficiency.

As described above, according to the present disclosure, although a digital interface module and an antenna unit are disposed to be stacked on each other in the interior of an enclosure in the Z-axis direction, filters can be disposed to be stacked on each other, namely, to face each other in the up-down direction, and first and second power amplification units, an up/down converter, and a power supply unit can be arranged in three dimensions on the inner surfaces of the enclosure, thereby accomplishing the compactness of a base station. In particular, heat sinks can be constituted on the outer surfaces of the enclosure, thereby solving a problem of heat dissipation of the boards.

In the antenna base station of the present disclosure, the boards can make surface-to-surface contact with a case, thereby efficiently dissipating heat generated from the boards.

In addition, in cases where boards are mounted on mounting portions of a filter housing, the adjacent boards can be electrically connected to each other through connection openings of the mounting portions without being exposed to the outside, thereby increasing stability and simplifying the assembly process of the antenna base station.

What is claimed is:

1. A base station device in a mobile communication system comprising:
    a hollow case having a polyhedral shape;
    a housing that is received in the case and has the same polyhedral shape as the case; and
    one or more board parts located between the case and the housing,
    wherein inner surfaces of the case are brought close to the board parts mounted on outer surfaces of the housing when the case is fastened to the housing.

2. The base station device of claim 1, wherein the board parts are mounted on the inner surfaces of the case.

3. The base station device of claim 2, wherein the board parts are mounted to be brought close to the inner surfaces of the case or to be spaced apart from the inner surfaces of the case by spacers.

4. The base station device of claim 2, wherein a heat dissipating fin for heat dissipation is formed on the outer surfaces of the case.

5. The base station device of claim 2, further comprising:
    an antenna mounted on a largest surface of the outer surfaces of the housing,
    wherein a partition wall functioning as a reflection plate of the antenna is formed on the outer surface of the housing on which the antenna is mounted, and the board parts are located on one or more remaining surfaces other than the surface on which the antenna is mounted among the outer surfaces of the housing.

6. The base station device of claim 2, wherein the board parts comprise two or more power amplification board parts, and the power amplification board parts are mounted on the surfaces with a greatest distance therebetween, respectively, while facing each other.

7. The base station device of claim 2, wherein the board parts comprise a power supply board part, and the power supply board part is mounted on the surface adjacent to the surfaces on which three or more other board parts are mounted, respectively.

8. The base station device of claim 1, wherein the board parts are mounted on the outer surfaces of the housing.

9. The base station device of claim 1, wherein the case comprises a plurality of plates that are coupled to each other to surround the outer surfaces of the housing.

10. The base station device of claim 9, wherein the plates are heat sinks having a heat dissipating fin.

11. The base station device of claim 1, wherein the housing has mounting portions formed on the outer surfaces thereof, wherein the one or more board parts are mounted on the mounting portions.

12. The base station device of claim 11, wherein the mounting portions have connection openings for electrically connecting the other board parts adjacent to each other.

13. The base station device of claim 1, further comprising:
    a thermal pad provided between one surface of each board part and the corresponding inner surface of the case.

* * * * *